United States Patent [19]

Ware et al.

[11] Patent Number: 5,337,285
[45] Date of Patent: Aug. 9, 1994

[54] METHOD AND APPARATUS FOR POWER CONTROL IN DEVICES

[75] Inventors: Frederick A. Ware, Los Altos Hills; James A. Gasbarro, Mountain View; John B. Dillon, Palo Alto; Matthew M. Griffin, Mountain View; Richard M. Barth; Mark A. Horowitz, both of Palo Alto, all of Calif.

[73] Assignee: Rambus, Inc., Mountain View, Calif.

[21] Appl. No.: 65,804

[22] Filed: May 21, 1993

[51] Int. Cl.<sup>5</sup> .............................................. G11C 7/00
[52] U.S. Cl. ................................... 365/227; 365/226; 365/233
[58] Field of Search ............ 365/227, 226, 233, 233.5, 365/229; 395/750

[56] References Cited

U.S. PATENT DOCUMENTS

| | | | |
|---|---|---|---|
| 4,937,789 | 6/1990 | Matsubara | 365/226 |
| 5,113,373 | 5/1992 | Lee | 365/227 |
| 5,193,198 | 3/1993 | Yokouchi | 365/227 X |
| 5,247,655 | 9/1993 | Khan et al. | 365/227 X |

Primary Examiner—Eugene R. LaRoche
Assistant Examiner—Son Mai
Attorney, Agent, or Firm—Blakely, Sokoloff, Taylor & Zafman

[57] ABSTRACT

A power control circuit to minimize power consumption of CMOS circuits by disabling/enabling the clock input to the CMOS circuit. A phase locked loop (PLL) or delay locked loop (DLL) drives a capacitive load of the component and a dummy load comparable to the component load. A standby latch is provided to control the clock input to the component. In a standby state, the clock signal is not provided to the component but the PLL/DLL continues to operate, driving the dummy load. Thus, when it is desirable to power on the circuit, the standby latch is reset and the clock signal is provided to the component, thereby turning on the component with little latency.

36 Claims, 5 Drawing Sheets

METHOD AND APPARATUS FOR POWER CONTROL IN DEVICES

BACKGROUND OF THE INVENTION

1. Field of the Invention

The present invention relates to the control of power in CMOS devices. More particularly, the present invention relates to the control of a synchronized clock in a CMOS device.

2. Art Background

Many solid state components such as processors and memory devices are implemented with CMOS circuits when they are utilized for power sensitive applications. CMOS circuits are desirable for low power operation as CMOS circuits dissipate very little power when not actively clocked. This provides a natural low power state for a system. Power is simply controlled by disabling the clock.

Figure 1:
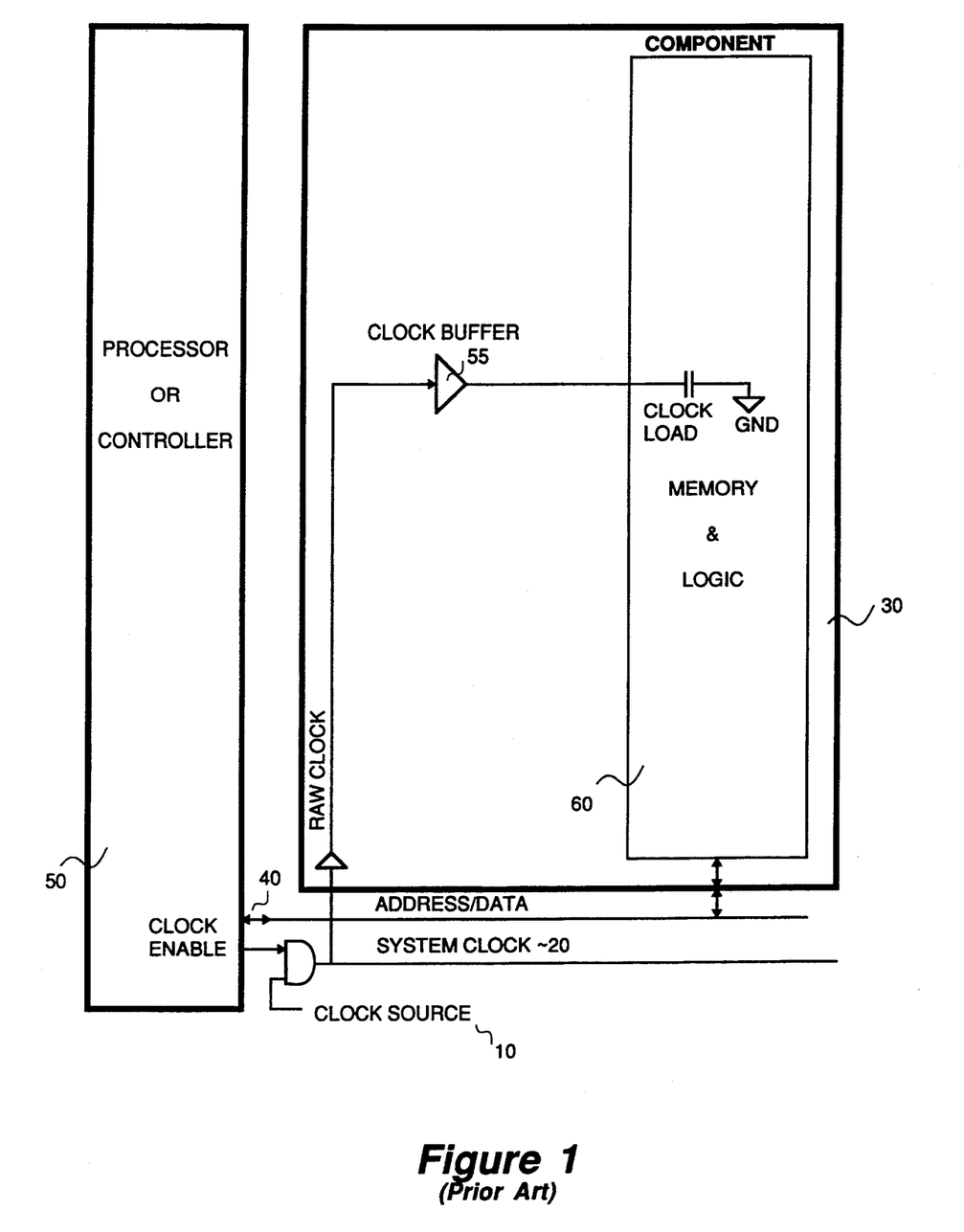
FIG. 1 is a prior art block diagram of a CMOS component driven by an external clock source.

An exemplary block diagram of a CMOS component controlled by a system clock is shown in FIG. 1. An external clock source 10 generates a system clock 20. Access by the CMOS component 30 to the clock signal 10 is controlled by the clock enable signal 40 generated by the processor or controller 50. The clock source 10 can be enabled and disabled quickly by the processor 50 to correspondingly turn off the CMOS component 30. The clock signal is buffered by clock buffer 55 in the CMOS component 30 in order to drive the capacitive load presented by the logic and memory circuits 60. In high performance CMOS devices, however, it may not be possible simply turn off the clock source. For example, when the CMOS device uses phase lock loop (PLL) or delay lock loop (DLL) circuits to create a synthesized clock, from the external clock signal received, the PLL/DLL may require long intervals of times, in the order of hundreds or thousands of clock cycles, in order to relock to the external clock. Thus, when the PLL/DLL is powered down, it becomes unsynchronized to the external clock. Therefore, each power down and power up process would require many clock cycles before the circuit was locked, synchronized and operational, making power down operations undesirable due to the latency involved.

SUMMARY OF THE INVENTION

It is therefore an object of the present invention to provide power control circuitry to control the power of high speed CMOS devices with moderate latency.

In a CMOS component, a timing generator circuit such as a phase locked loop (PLL) or delay locked loop (DLL) circuit receives an external clock and synthesizes an internal clock which is coupled to a first buffer to drive a large capacitive load on the component. A separate buffer coupled to the timing generator circuit drives a dummy clock load. The buffers and the loads are designed so that the timing delays are the same. The timing generator is controlled by the external clock signal received such that the clock signal generated by the timing generator is compared to the external clock signal and if the two clocks do not match, the timing generator is adjusted until a match is achieved. This process of synchronizing is continuous and depends on the continued presence of the external clock source. A standby latch is provided to control the clock input to the first buffer and the component memory and logic circuitry. In a first state the clock buffer to the memory and logic circuitry is disabled. However, when in this state, the timing generator continues to operate, driving the dummy clock load. Thus, when it is desirable to power on the circuit, the standby latch is reset and the clock buffer for the memory and the logic circuitry is enabled thereby providing the clock signal to drive the components with little latency.

As the timing generator remains on during stand by mode, the timing generator does not need to relock its synthesized clock to the external clock. With careful design, the dissipation due to the timing generator and dummy clock load can be kept to 1/10 to 1/100 of the power of the entire component when fully activated thereby maintaining power down savings while minimizing latency when switching between power down and power on modes in the circuit.

BRIEF DESCRIPTION OF THE DRAWINGS

The objects, features and advantages of the present invention will become apparent to one skilled in the art from the following detailed description in which.

DETAILED DESCRIPTION OF THE INVENTION

In the following description, for purposes of explanation, numerous details are set forth in order to provide a thorough understanding of the present invention. However, it will be apparent to one skilled in the art that these specific details are not required in order to practice the invention. In other instances, well known electrical structures and circuits are shown in block diagram form in order not to obscure the present invention unnecessarily. The invention will be described with reference to CMOS devices. However, the invention is readily applied to other types of devices.

Figure 2:
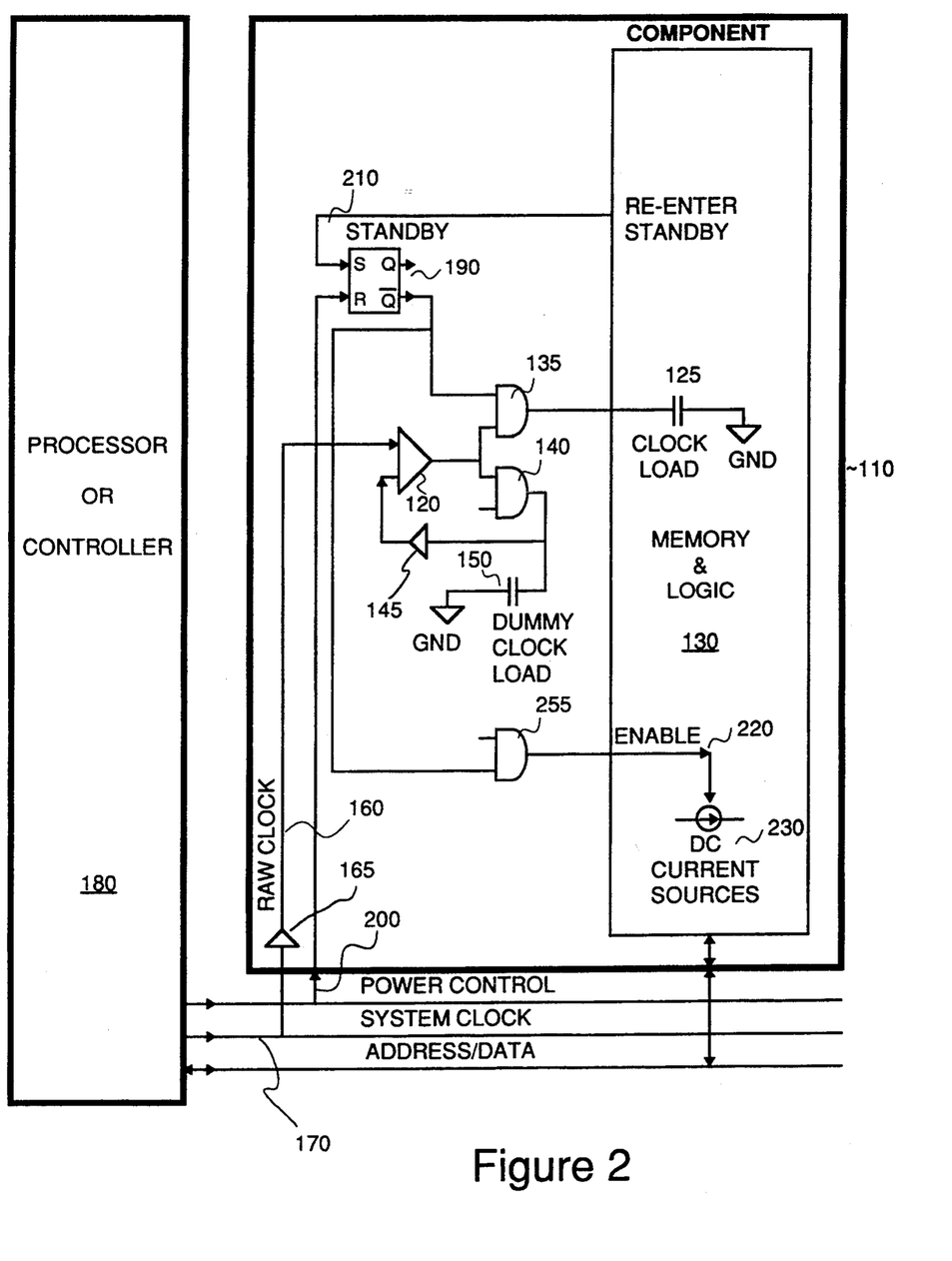
FIG. 2 is a block diagram of one embodiment of the present invention.

FIG. 2 is a block diagram representation which illustrates the standby mode which enables the CMOS component 110 to be powered down with minimal latency. A timing generator circuit 120 such as a phase locked loop circuit or delay locked loop circuit synthesizes an internal clock signal from the external clock signal for input to buffer 135 which drives a large capacitive load 125 such as memory and logic 130. Depending upon the component, the memory of memory and logic 130 can include registers as well as other memory components.

A separate buffer 140 drives a dummy clock load 150. The two buffers 135, 140 and two loads 125, 150 are designed so the delays incurred are the same. Although the loads can be the same, it is preferable that the dummy clock load 150 and buffer 140 are scaled down to minimize power consumption while maintaining the same delay as the buffer 135 and clock load 125.

The clock signal output by buffer 140 passes through buffer 145 and is compared to the raw clock signal 160 received from the system clock 170 through a buffer 165. Buffers 145 and 165 are constructed with matching delays to provide similar timing. The system clock is generated by the processor or controller 180. Alternatively the system clock can be generated by another component. If the two clock signals do not match, the timing generator is adjusted until the output of buffer 145 matches the raw clock signal 160. Thus, the outputs of buffers 135 and 140 will match the system clock 170. This process is referred to as locking or synchronizing and typically takes a long period of time, on the order of 1 to 100 microseconds. It should be noted that a clock period is typically 4-30 nanoseconds so that the latency incurred for synchronizing is great. The process of remaining in synchronization is one that is done continually and depends on the continued presence of the system clock 170.

In order to save on power consumption it is desirable to shut down all or a portion of components when not in use. However, it is not possible to simply shut down the external clock source, such as system clock 170, between operations without introducing a huge latency penalty. The standby mode described enables the reduction of power consumption while still maintaining synchronization with the external clock. Logic is provided to shut down the clock input to all or a portion of the memory and logic portion of the component 130 while maintaining the loop which drives the dummy clock load 150 and also feeds back into the timing generator 120 for synchronization with the system clock 170.

In the embodiment shown in FIG. 2, an SR latch 190 receives as inputs a power control signal 200 and a re-enter standby signal 210. The output of the standby latch 190 is input to AND gate 135, which also receives as input the output of the timing generator 120. Thus, when the re-enter standby signal 210 pulses temporarily to a high state, the Q output of the standby latch transitions high, and the $\overline{Q}$ output coupled to the AND gate 135 is low. The AND gate 135, which functions as the clock buffer to the memory and logic circuitry of the component 130, inhibits the clock signal from being input to drive the component memory and logic 130 due to the $\overline{Q}$ input signal, resulting in the component being placed in standby mode. When the power control signal 200 is subsequently pulsed to a high level, the standby latch is reset low and the $\overline{Q}$ output is high which enables the clock buffer for the memory and logic circuitry 130 by outputting the clock signal through AND gate 135. Furthermore, when the component has finished the operation for which it was activated, it can re-enter a standby mode by pulsing the re-enter standby signal 210 causing the Q output of the standby latch to be set high.

As the timing generator 120 is maintained in a locked state via the loop which drives the dummy load, the exit from standby mode to full operational or active mode simply takes one latch delay and one buffer delay. Re-entry into the standby mode is equally fast. This is due to the fact that the timing generator does not need to relock its synthesized clock to the system clock 170 because the feedback loop with the dummy clock load 150 remains on in standby mode. Although the standby mode does not completely eliminate power consumption, with careful design the dissipation during standby mode can be kept to 1/10 to 1/100 of the component power when fully activated.

A CMOS component may also have DC current sources. Typically these sources may easily be turned on and off with a digital signal. The standby latch 190 thus may be used to enable and disable the DC source of power dissipation in order to drive the standby power level as low as possible without adding latency to the power control. Any such current source may be disabled so long as the feedback loop is not disturbed. This is shown in FIG. 2 in which gate 215 drives enable signal 220 to enable and disable DC current sources 230.

In an alternate embodiment, memory and logic 130 can include multiple clock loads, each corresponding to a different portion of the memory and logic 130. In this embodiment, each clock load can be individually or jointly controlled to correspondingly power down different portions of memory and logic 130. In this embodiment, the clock signals to each clock load are enabled/disabled using separate latches and buffers, the size of the clock load and delay through the buffers being proportional to the dummy clock load and buffer such that the timing is the same.

Figure 3:
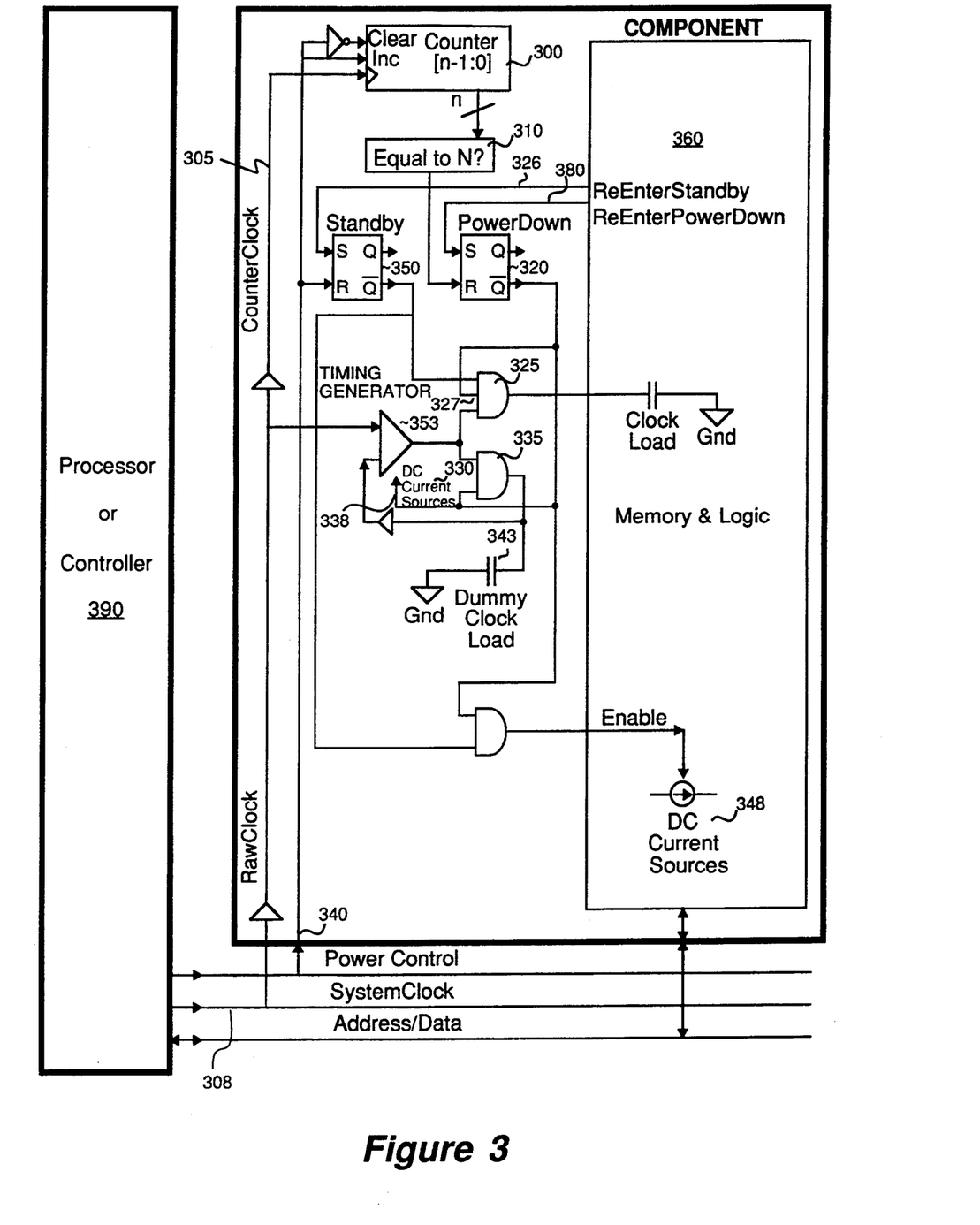
FIG. 3 is a block diagram illustration of an alternate embodiment of the present invention wherein the component is fully powered down.

The power savings available in the standby mode may be further improved. Alternatively, a second low power mode, referred to herein as the power down mode, is provided. Referring to FIG. 3, in power down mode, the timing generator feedback loop through buffer 335 to timing generator 353 is disabled further eliminating the power dissipated by the loop. A power down signal 380 to enter power down mode is generated by the memory and logic portion of the component 360. The entry latency is similar to the entry latency into the standby mode. Alternately, an external signal can also serve as a source of the signal to enter the power down mode. In this situation, the power down mode can be entered directly from active mode or standby mode. The power down mode is exited when a pulse that is greater than N*Clockcycles is detected on the power control signal line 340. Alternatively, a dedicated signal line can be utilized to assert a signal to exit power down mode. Preferably, the pulse width is measured by an n-bit counter $(2^n > N)300$ which runs on a counter clock 305 derived from the system clock 308. Because there is likely to be skew between the internal counter clock 305 and the external system clock 308, it is preferable to add some margin to the N*Clockcycle pulse width in order to ensure that the component exits the power down mode when desired.

The power down mode is entered by asserting signal 380 to power down latch 320. The output of power down latch 320 disables the timing generator 353 input to component 360 via input 327 to AND gate 325 and further disables the feedback loop 330 via AND gate 335. Furthermore, the DC source to the phase lock loop 338 is also disabled. When the power down latch is subsequently cleared, the clock buffer 335 for the dummy clock load 343 is re-enabled allowing the phase lock loop 353 to begin the process of relocking the synthesized clock to the system clock signal 308.

Clearing the power down latch 320 also re-enables the DC sources 348 and the phase lock loop 338 which may also contribute to power dissipation during standby mode. As the standby mode is exited when a rising edge is seen on the power control line 340, and the power down mode is exited when a pulse of minimum width N is seen on power control line 340, the processor or controller 390 can permit some components to be placed in power down mode while other components are switched between active and standby mode. This flexibility is achieved because the power control circuitry is placed within each component.

Figure 4:
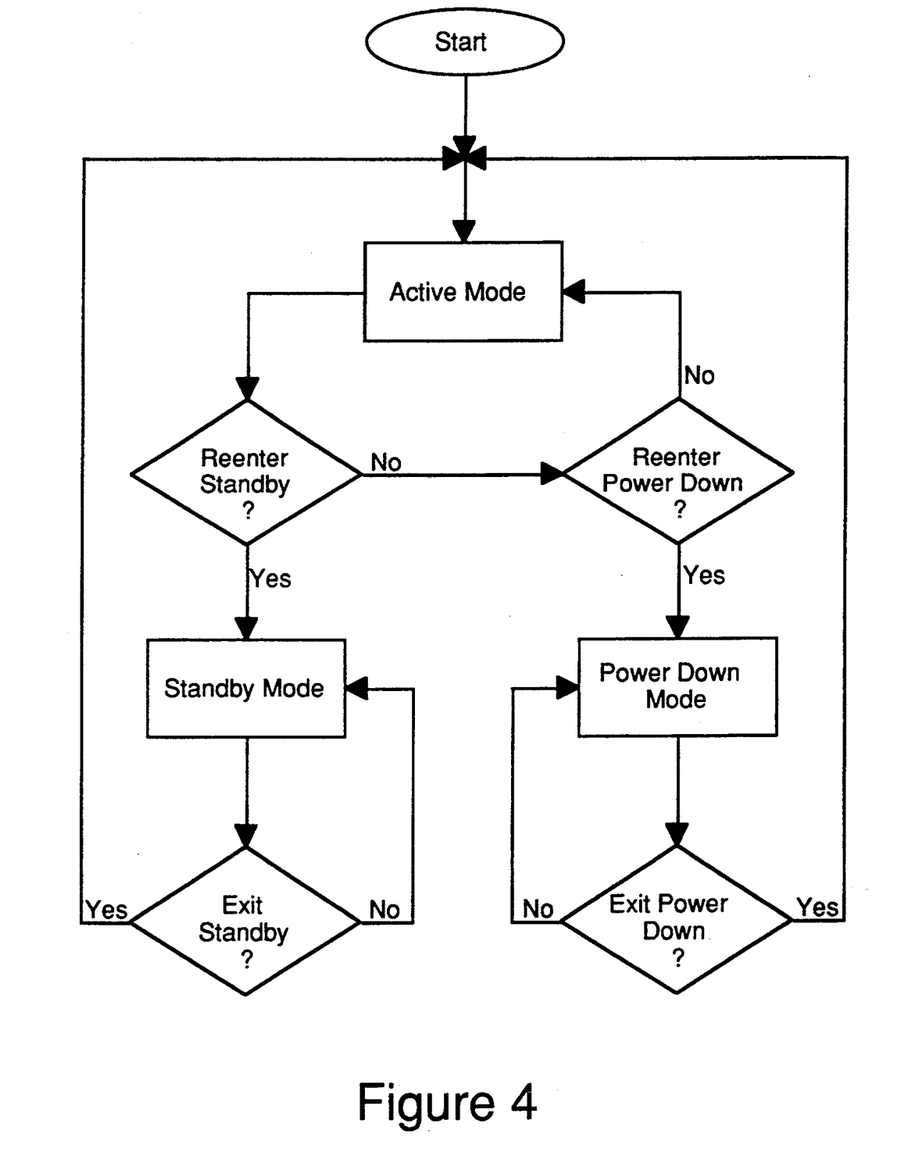
FIG. 4 is an exemplary flow diagram of the process flow for power control in the standby and power down modes.

Preferably, power control circuit provides the flexibility to use either standby or power down modes. This is illustrated by the flow diagram of FIG. 4. FIG. 4 provides an exemplary process flow for control of the standby and power down modes. However, it is readily apparent that other variations of the process illustrated can be used.

It should be noted that power control of the component is not limited to a single power down threshold of N*Clockcycles. Several thresholds may be defined. Care should be taken to separate the thresholds by a sufficient amount to account for skew between the power control signal and the internal counter clock used by the n-bit counter. The multiple thresholds will permit several levels of low power operation. An example is discussed in an alternate embodiment below.

Figure 5:
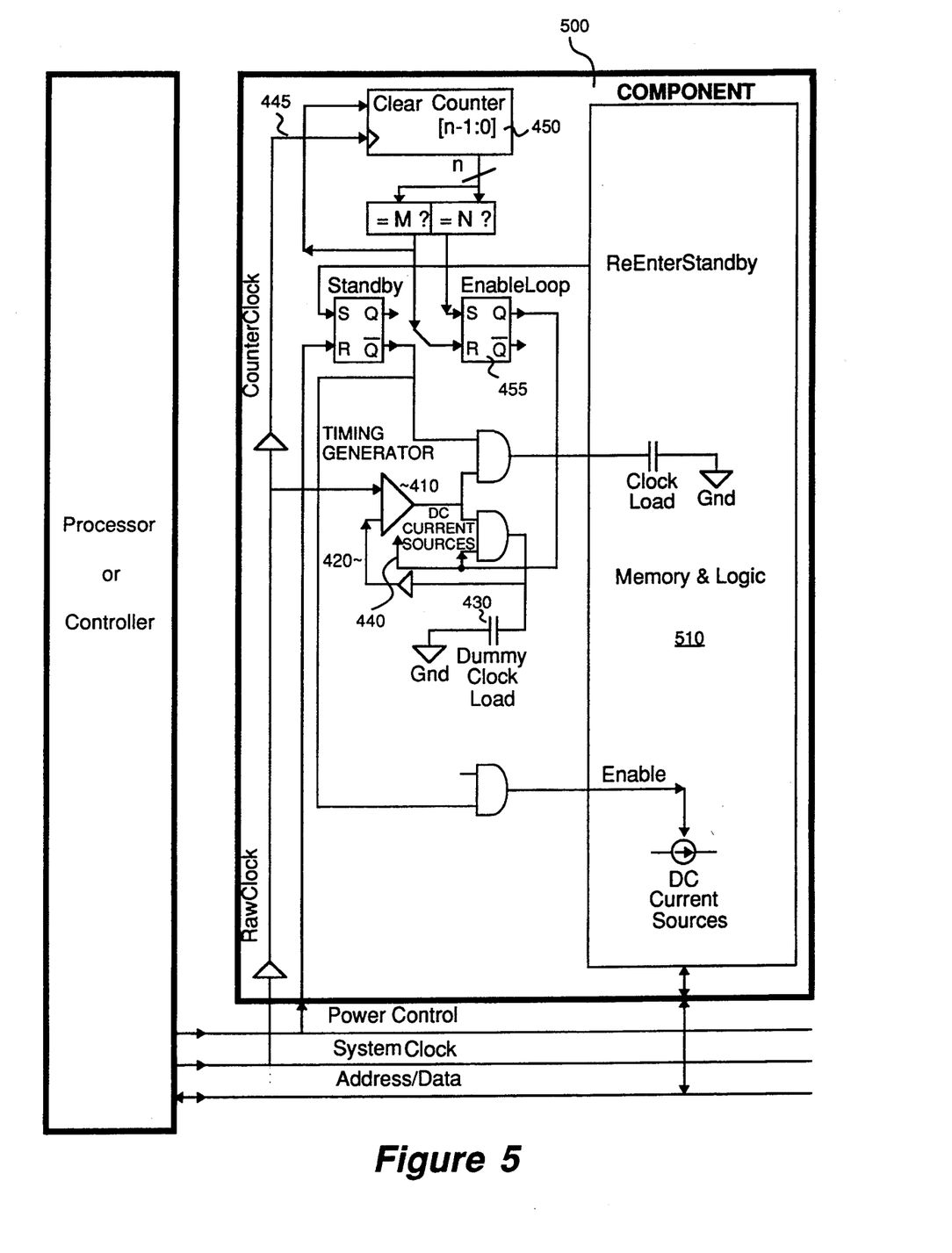
FIG. 5 is a block diagram illustration of another alternate embodiment of the present invention.

In an alternate embodiment, illustrated by the block diagram of FIG. 5, the timing generator 410 is designed such that it can tolerate periodic removal of its feedback loop 420 to the dummy clock load 430 and its DC current sources 440. This is possible if, for example, the synchronization information is maintained as an analog voltage on a capacitor (not shown). As long as the voltage is updated before leakage currents cause the voltage to drift too far, the timing generator 410 can tolerate the periodic removal of the feedback loop and DC current sources. Therefore, a two threshold counter/comparator circuit is utilized. An n-bit counter 450 runs freely on an internal counter clock 445 which is continuously compared to two threshold values M and N, wherein $2^n > M > N$. When the amount of N is detected, the enable loop latch 455 is set, turning the feedback loop 420 on and the current sources 440 on. When the mount of M value is subsequently detected, the enable loop latch 455 is cleared and the counter is cleared disabling the timing generator 410. The amount of power dissipation is therefore equal to (M−N)/M of the power consumed during standby power mode. The value counts of M and N permit the timing generator 410 to be turned on and off in accordance with its toleration for power down while still retaining synchronized information.

In the embodiment illustrated in FIG. 5, the threshold counter/comparator circuit cycles continuously between an on/off status during the operational mode of the circuit. However, the loop can alternatively be triggered by an external power control signal to periodically turn the timing generator on/off while maintaining synchronization information. Furthermore, it is readily apparent that more than two thresholds may be utilized to provide varying processes for controlling power consumption in the circuit.

The invention has been described in conjunction with the preferred embodiment. It is evident that numerous alternatives, modifications, variations and uses will be apparent those skilled in the art in light of the foregoing description.

What is claimed is:

1. A component comprising memory and logic which, when driven by a clock signal, consumes power, said component receiving an external clock signal, said component comprising circuitry to decrease the power consumption of the component when the component is not in use, said circuitry comprising:
   a timing generator for receiving the external clock and generating an internal clock signal synchronized to the external clock;
   at least one first logic gate means which receives as input a standby signal and the internal clock signal;
   a feedback loop which receives the external clock signal, and drives a dummy clock load proportional to at least one clock load of the memory and logic of the component, said feedback loop coupled back to the timing generator to provide the internal clock signal feedback needed to operate the timing generator;
   at least one standby latch receiving as input a first power control signal of a first state to reduce the power of at least a portion of the component, said latch upon receipt of the first power control signal generating the standby signal for input to the first logic gate means, such that the clock signal is not input to at least a portion of the memory and logic of the component, shutting down operation of at least a portion of the memory and logic and therefore the power consumed by the memory and logic, said standby latch upon receipt of a second power control signal, generating the standby signal of a second state which enables the internal clock signal to drive the memory and logic to operate;
   wherein the operation of the timing generator is unaffected by the standby mode due to the feedback loop driving the dummy clock load, such that minimal latency is incurred switching in and out of standby mode.

2. The component as set forth in claim 1, further comprising a re-enter standby signal asserted by the memory and logic of the component and coupled to the input of the first logic gate means, such that when the re-enter standby signal is asserted, the operation of at least a portion of the memory and logic is shut down by inhibiting the clock input to the at least a portion of the memory and logic of the component.

3. The component as set forth in claim 1, wherein the standby signal generated by the standby latch is coupled to DC current sources in the component to disable DC current sources when in standby mode.

4. The component as set forth in claim 1, wherein the timing generator comprises a phase locked loop.

5. The component as set forth in claim 1, wherein the timing generator comprises a delay locked loop.

6. The component as set forth in claim 1, further comprising means for generating a power down mode, said means comprising:
   a power down latch receiving as input a third power control signal, said latch upon receipt of the third power control signal disabling operation of the feedback loop such that a clock signal is not generated by the timing generator;
   control means coupled to receive a fourth power control signal and coupled to the power down latch such that when the fourth power control signal is received a reset signal is asserted on the power down latch which enables the feedback loop to enable the timing generator to begin generating an internal clock signal.

7. The component as set forth in claim 6, wherein:
   the fourth power control signal is a signal of pulse width N; and
   the control means comprises a counter which counts the pulse widths of the power control signal received such that when a power control signal of pulse width N is received, the reset signal is asserted on the power down latch.

8. The component as set forth is claim 6, wherein the third power control signal is asserted by the component.

9. The component as set forth in claim 6, wherein the third power control signal is asserted by an external source.

10. The component as set forth in claim 1 further comprising means for generating a lower latency power down mode comprising:
- a control means coupled to receive a fifth power control signal and sixth power control signal, said control means upon receipt of the fifth power control signal issuing a power down signal to power down the timing generator, and upon receipt of the sixth power control signal, said control means issuing a reset signal to reinitiate operation of the timing generator;
- a low latency power down latch receiving as input the power down and reset signal, wherein upon receipt of the power down signal, said latch disabling operation of the feedback loop such that a clock signal is not generated by the timing generator and upon receipt of the reset signal, said latch enables the feedback loop and the timing generator to begin generating an internal clock signal;
- wherein the fifth and sixth power control signals can be asserted to periodically restart the timing generator.

11. The component as set forth in claim 10, wherein the fifth power control signal comprises a signal pulsed after N*Clockcycles and the sixth power control signal comprises a signal pulsed after M*Clockcycles, wherein M is greater than N, and said control means comprises:
- a counter to count the clock cycles, and cleared after M*Clockcycles;
- a comparator to compare the number of clock cycles counted by the counter to predetermined values of M and N, said comparator generating a power down signal when the count equals N and a reset signal when the count equals M.

12. The component as set forth in claim 11, wherein the values of M and N are chosen such that the timing generator is shut down for a period of time within which synchronizing information is maintained such that when the timing generator begins generating the internal clock signal the signal is synchronized to the external clock.

13. The component as set forth in claim 1, wherein the component is a CMOS device.

14. The component as set forth in claim 1, wherein the component comprises a plurality of clock loads corresponding to different portions of the memory and logic, each clock load coupled to a standby latch via a first logic gate means, wherein the clock input to different portions of the memory and logic circuit can be disabled, shutting down operation of specific portions of the memory and logic.

15. The component as set forth in claim 1, wherein the dummy clock load is a scaled load of the clock load of the memory and logic such that the power consumption by the timing generator means driving the dummy clock load is minimized while maintaining the internal clock signal feedback.

16. A component comprising memory and logic which, when driven by a clock signal, consumes power, said component receiving an external clock signal, said component comprising circuitry to decrease the power consumption of the component, said circuitry comprising:
- a timing generator means for receiving the external clock signal and generating an internal clock signal synchronized to the external clock, said timing generator means driven by a current input;
- a first logic gate means which receives as input the internal clock signal;
- a feedback loop which receives the external clock signal and drives a dummy clock load proportional to at least one clock load of the memory and logic of the component, said feedback loop coupled back to the timing generator means to provide the internal clock signal feedback needed to operate the timing generator means;
- a power down latch receiving as input a first power control signal, said power down latch upon receipt of the first power control signal disabling operation of the feedback loop such that the internal clock signal is not generated by the timing generator means;
- control means coupled to receive a second power control signal and coupled to the power down latch such that when the second power control signal is received, a reset signal is asserted on the power down latch which enables the feedback loop to enable the timing generator means to begin generating an internal clock signal.

17. The component as set forth in claim 16, wherein an output of the power down latch comprises an enter power down signal, and the first logic gate means further receives as input the enter power down signal, such that when said power down latch receives the first power control signal, the enter power down mode signal is input to the first logic gate means inhibiting the clock signal from being input to at least a portion of the memory and logic of the component, thereby immediately shutting down operation of at least a portion of the memory and logic.

18. The component as set forth in claim 16, wherein the first power down signal is an externally generated signal.

19. The component as set forth in claim 16, wherein the first power down signal is generated by the component.

20. The component as set forth in claim 16, wherein when the power down latch receives as input the first power control signal, DC current sources input to the timing generator are disabled.

21. The component as set forth in claim 16, wherein when the power down latch receives as input the first power control signal, DC current sources in the component are disabled.

22. The component as set forth in claim 16, wherein:
- the second power control signal is a signal of pulse width N; and
- the control means comprises a counter which counts the pulse widths of the power control signal received such that when a power control signal of pulse width N is received, the reset signal is asserted on the power down latch.

23. A component comprising memory and logic which, when driven by a clock signal, consumes power, said component receiving an external clock signal, said component comprising circuitry to decrease the power consumption of the component, said circuitry comprising:
- a timing generator means for receiving the external clock signal and generating an internal clock signal synchronized to the external clock, said timing generator means driven by a current input;
- a first logic gate means which receives as input the internal clock signal;

a feedback loop which receives the external clock signal and drives a dummy clock load proportional to at least one clock load of the memory and logic of the component, said feedback loop coupled back to the timing generator means to provide the internal clock signal feedback needed to operate the timing generator means;

a low latency power down latch receiving as input a power down signal and reset signal, wherein upon receipt of the power down signal, said latch disabling the operation of the feedback loop such that a clock signal is not generated by the timing generator means, and upon receipt of the reset signal, said latch enables the feedback loop and the timing generator means to begin generating an internal clock signal; and control means coupled to receive a first power control signal and second power control signal, said control means upon receipt of the first power control signal issuing a power down signal to power down the timing generator means, and upon receipt of the second power control signal, said control means issuing a reset signal to reinitiate operation of the timing generator means;

wherein the first and second power control signals can be asserted to periodically restart the timing generator means.

24. The component as set forth in claim 23, wherein the first power control signal comprises a signal pulsed after N clock cycles and the second power control signal comprises a signal pulsed after M clock cycles, wherein M is greater than N, and said control means comprises:

a counter to count the clock cycles and cleared after M clock cycles;

a comparator to compare the number of clock cycles counted by the counter to predetermined values of M and N, said comparator generating a power down signal when the count equals N and reset signal when the count equals M.

25. The component as set forth in claim 24, wherein the values of M and N are chosen such that the timing generator means is shut down for a period of time within which synchronizing information is maintained such that when the timing generator means begins generating the internal clock signal, the signal is synchronized to the external clock.

26. In a component comprising memory and logic which when driven by a clock signal consumes power, said component receiving an external clock signal, a method to decrease the power consumption of the component when the component is not in use, comprising the steps of:

receiving an external clock signal and generating an internal clock signal synchronized to the external clock signal, said internal clock signal driving the component;

feeding back the internal clock signal to drive a dummy clock load proportional to at least one clock load of the memory and logic of the component and provide feedback information to maintain the internal clock signal synchronous with the external clock signal;

issuing a first power control signal of a first state to reduce the power of at least a portion of the component;

inhibiting the internal clock signal from driving at least a portion of the memory and logic of the component when the first power control signal is issued, wherein the internal clock signal continues to be generated based upon the external clock signal and fed back internal clock signal driving a dummy clock load; and when a second power control signal is issued, enabling the internal clock signal to drive the at least a portion of the memory and logic of the component;

wherein minimal latency is incurred controlling the power consumption of the component.

27. The method as set forth in claim 26, wherein said method further comprises the step of disabling DC current sources when the first power control signal is issued, further minimizing power consumption, said DC current sources reenabled when a second power control signal is issued.

28. The method as set forth in claim 26, further comprising the steps of:

issuing a third power control signal;

when the third power control signal is issued, inhibiting the generation of the internal clock signal by inhibiting the feedback of the internal clock signal which drives a dummy clock load, thereby further minimizing power consumption;

when a fourth power control signal is received, enabling the feed back of the internal clock signal to drive the dummy clock load.

29. The method as set forth in claim 28, wherein the fourth power control signal comprises a signal of pulse width N, said method further comprising the step of counting the pulse widths of power control signals received to determine when the fourth power control signal is issued.

30. The method as set forth in claim 26, further comprising the steps of:

periodically issuing a fifth power control signal and sixth power control signal;

when the fifth power control signal is issued, inhibiting the generation of the internal clock signal by inhibiting the feedback of the internal clock signal which drives a dummy clock load, thereby further minimizing power consumption; and when the sixth power control signal is issued, enabling the feed back of the internal clock signal to drive the dummy clock load; wherein the internal clock is periodically generated to maintain a synchronous relationship with the external clock signal.

31. The method as set forth in claim 30, wherein the fifth power control signal comprises a signal pulsed after N clock cycles and the sixth power control signal comprises a signal pulsed after M clock cycles, wherein M is greater than N, said method further comprising the steps of:

counting the number of clock cycles between pulsed signals; and comparing the number of clock cycles counted;

wherein it is determined when the fifth and sixth power control signals are issued.

32. The method as set forth in claim 26, further comprising the step of scaling the dummy clock load to a scaled version of the clock load of the memory and logic such that the power consumption by the timing generator means driving the dummy clock load is minimized while maintaining the internal clock signal feedback.

33. In a component comprising memory and logic which when driven by a clock signal consumes power, said component receiving an external clock signal, a method to decrease the power consumption of the component, comprising the steps of:

receiving an external clock signal and generating an internal clock signal synchronized to the external clock signal, said internal clock signal driving the component;

feeding back the internal clock signal to drive a dummy clock load proportional to at least one clock load of the memory and logic of the component and provide feedback information to maintain the internal clock signal synchronous with the external clock signal;

issuing a first power control signal;

when the first power control signal is issued, inhibiting the generation of the internal clock signal by inhibiting the feedback of the internal clock signal which drives a dummy clock load, thereby further minimizing power consumption;

when a second power control signal is received, enabling the feedback of the internal clock signal to drive the dummy clock load.

34. The method as set forth in claim 33, wherein the second power control signal comprises a signal of pulse width N, said method further comprising the step of counting the pulse widths of power control signals received to determine when the second power control signal is issued.

35. In a component comprising memory and logic which when driven by a clock signal consumes power, said component receiving an external clock signal, a method to decrease the power consumption of the component, comprising the steps of:

receiving an external clock signal and generating an internal clock signal synchronized to the external clock signal, said internal clock signal driving the component;

feeding back the internal clock signal to drive a dummy clock load proportional to at least one clock load of the memory and logic of the component and provide feedback information to maintain the internal clock signal synchronous with the external clock signal;

periodically issuing a first power control signal and second power control signal;

when the first power control signal is issued, inhibiting the generation of the internal clock signal by inhibiting the feedback of the internal clock signal which drives a dummy clock load, thereby minimizing power consumption; and     when the second power control signal is issued, enabling the feed back of the internal clock signal to drive the dummy clock load; wherein the internal clock is periodically generated to maintain a synchronous relationship with the external clock signal.

36. The method as set forth in claim 35, wherein the first power control signal comprises a signal pulsed after N clock cycles and the second power control signal comprises a signal pulsed after M clock cycles, wherein M is greater than N, said method further comprising the steps of:

counting the number of clock cycles between pulsed signals; and     comparing the number of clock cycles counted;

wherein it is determined when the first and second power control signals are issued.

* * * * *